(12) United States Patent
Shen et al.

(10) Patent No.: US 9,846,643 B2
(45) Date of Patent: Dec. 19, 2017

(54) METHODS FOR MAINTAINING A STORAGE MAPPING TABLE AND APPARATUSES USING THE SAME

(71) Applicant: Silicon Motion, Inc., Jhubei (TW)

(72) Inventors: Yang-Chih Shen, Taipei (TW); Hou-Yun Lee, Taichung (TW)

(73) Assignee: Silicon Motion, Inc., Jhubei (TW)

( * ) Notice: Subject to any disclaimer, the term of this patent is extended or adjusted under 35 U.S.C. 154(b) by 91 days.

(21) Appl. No.: 14/738,500

(22) Filed: Jun. 12, 2015

(65) Prior Publication Data

US 2016/0062908 A1    Mar. 3, 2016

(30) Foreign Application Priority Data

Sep. 2, 2014    (TW) .............................. 103130202 A

(51) Int. Cl.
  *G06F 12/02*   (2006.01)
  *G06F 12/10*   (2016.01)
  *G11C 7/10*    (2006.01)

(52) U.S. Cl.
  CPC ........ *G06F 12/0246* (2013.01); *G11C 7/1072* (2013.01); *G06F 2212/1016* (2013.01); *G06F 2212/7201* (2013.01)

(58) Field of Classification Search
  CPC ............. G06F 12/1009; G06F 12/1027; G06F 2212/657; G06F 2212/68
  See application file for complete search history.

(56) References Cited

U.S. PATENT DOCUMENTS 8,341,340 B2    12/2012  Rub
2004/0010487 A1  1/2004  Prahlad et al.
2008/0189490 A1  8/2008  Cheon et al.
2009/0172039 A1  7/2009  Honami et al.
2016/0011790 A1*  1/2016  Rostoker ............... G06F 3/0611
                                                                  711/103

FOREIGN PATENT DOCUMENTS

TW    201135746 A1   10/2011
TW    201411347 A     3/2014
TW    201413453 A     4/2014

OTHER PUBLICATIONS

Office Action of corresponding TW application, published on Aug. 24, 2015.
Office Action of corresponding TW application, published on Jan. 15, 2016.
Office Action of co-pending U.S. Appl. No. 14/862,913, dated Sep. 26, 2017.

* cited by examiner

Primary Examiner — Yong Choe
(74) Attorney, Agent, or Firm — Wang Law Firm, Inc.

(57) ABSTRACT

A method for maintaining a storage mapping table. An access interface is directed to read a group mapping table from the last page of a block of a storage unit. The block is allocated to store data of a plurality of groups, each group stores information indicating which location in the storage unit stores data of an LBA (Logical Block Address) range, and the group mapping table stores information indicating which unit of the block stores the latest data of each group. The group mapping table is stored in a DRAM (Dynamic Random Access Memory). The access interface is directed to read data of each group from the storage unit according to the group mapping table. The data of each group is stored in a specified location of a storage mapping table of the DRAM.

16 Claims, 12 Drawing Sheets

METHODS FOR MAINTAINING A STORAGE MAPPING TABLE AND APPARATUSES USING THE SAME

CROSS REFERENCE TO RELATED APPLICATIONS

This Application claims priority to Taiwan Patent Application No. 103130202, filed on Sep. 2, 2014, the entirety of which is incorporated by reference herein.

BACKGROUND

Technical Field

The present invention relates to flash memory, and in particular to methods for maintaining a storage mapping table and apparatuses using the same.

Description of the Related Art

Flash memory devices typically include NOR flash devices and NAND flash devices. NOR flash devices are random access—a host accessing a NOR flash device can provide the device any address on its address pins and immediately retrieve data stored in that address on the device's data pins. NAND flash devices, on the other hand, are not random access but serial access. It is not possible for NOR to access any random address in the way described above. Instead, the host has to write into the device a sequence of bytes which identifies both the type of command requested (e.g. read, write, erase, etc.) and the address to be used for that command. The address identifies a page (the smallest chunk of flash memory that can be written in a single operation) or a block (the smallest chunk of flash memory that can be erased in a single operation), and not a single byte or word. In practice, to improve the write speed, data of continuous logic addresses may be dispersed into physical storage units, and a storage mapping table is used to point to where the data is written in physical storage units. Accordingly, what is needed are methods for maintaining a storage mapping table to improve the rebuild speed, and apparatuses that use these methods.

BRIEF SUMMARY

An embodiment of the invention introduces a method for maintaining a storage mapping table, performed by a processing unit, including at least the following steps. An access interface is directed to read a group mapping table from the last page of a block of a storage unit. The block is allocated to store data of a plurality of groups, each group stores information indicating which location in the storage unit stores data of an LBA (Logical Block Address) range, and the group mapping table stores information indicating which unit of the block stores the latest data of each group. The group mapping table is stored in a DRAM (Dynamic Random Access Memory). The access interface is directed to read data of each group from the storage unit according to the group mapping table. The data of each group is stored in a specified location of a storage mapping table of the DRAM.

An embodiment of the invention introduces an apparatus for maintaining a storage table that includes an access interface and a processing unit. The access interface is coupled to a storage unit. The processing unit, coupled to the access interface, directs the access interface to read a group mapping table from the last page of a block of a storage unit. The block is allocated to store data of a plurality of groups, each group stores information indicating which location in the storage unit stores data of an LBA range, and the group mapping table stores information indicating which unit of the block stores the latest data of each group. The processing unit further stores the group mapping table to a DRAM, directs the access interface to read data of each group from the storage unit according to the group mapping table, and stores the data of each group in a specified location of a storage mapping table of the DRAM.

A detailed description is given in the following embodiments with reference to the accompanying drawings.

BRIEF DESCRIPTION OF THE DRAWINGS

The present invention can be fully understood by reading the subsequent detailed description and examples with references made to the accompanying drawings, wherein.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Figure 1:
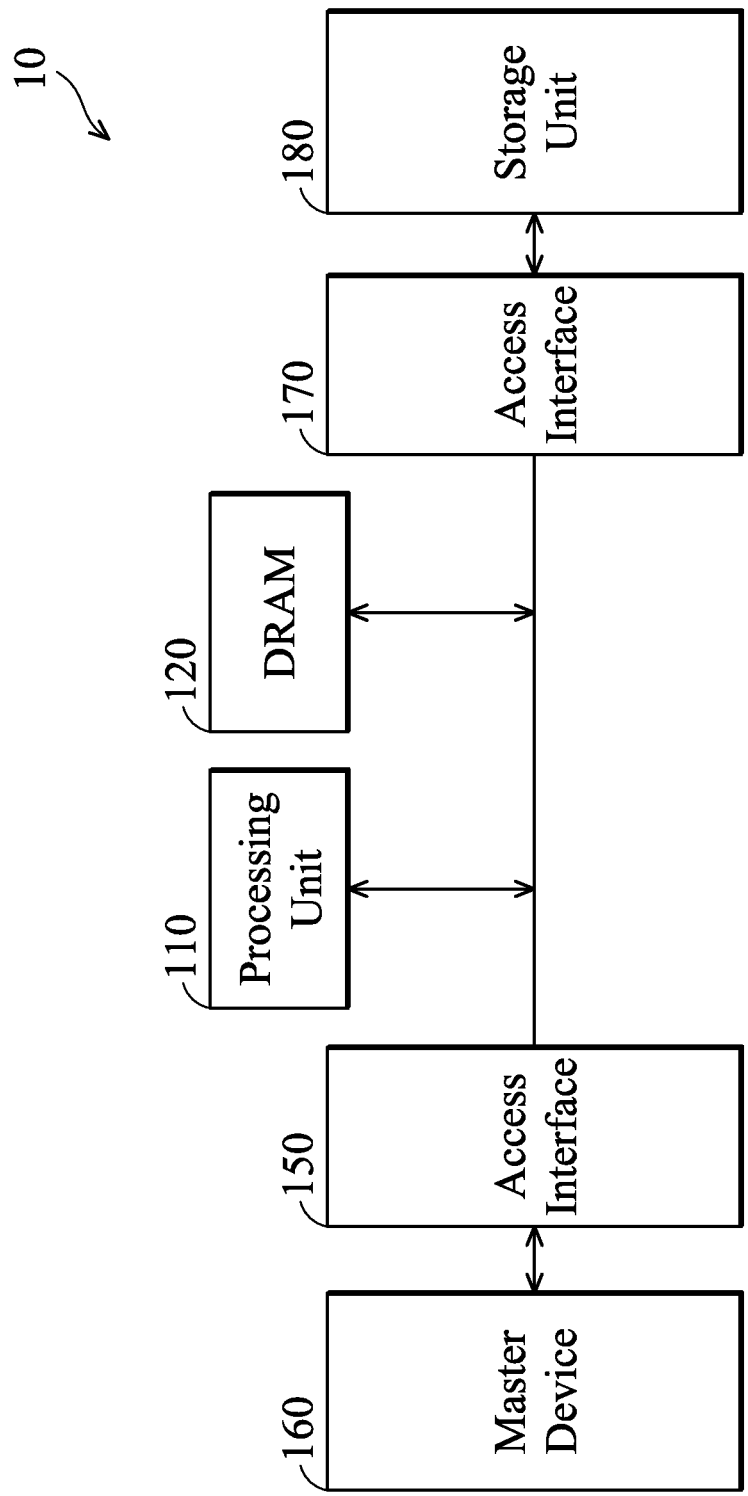
FIG. 1 is the system architecture of a flash memory according to an embodiment of the invention.

FIG. 1 is the system architecture of a flash memory according to an embodiment of the invention. The system architecture 10 of the flash memory contains a processing unit 110 being configured to write data into a designated address of a storage unit 180, and read data from a designated address thereof. Specifically, the processing unit 110 writes data into a designated address of the storage unit 10 through an access interface 170 and reads data from a designated address thereof through the same interface 170. The system architecture 10 uses several electrical signals for coordinating commands and data transfer between the processing unit 110 and the storage unit 180, including data lines, a clock signal and control lines. The data lines are employed to transfer commands, addresses and data to be written and read. The control lines are utilized to issue control signals, such as CE (Chip Enable), ALE (Address Latch Enable), CLE (Command Latch Enable), WE (Write Enable), etc. The access interface 170 may communicate with the storage unit 180 using a SDR (Single Data Rate) protocol or a DDR (Double Data Rate) protocol, such as ONFI (open NAND flash interface), DDR toggle, or others. The processing unit 110 may communicate with other electronic devices through an access interface 150 using a standard protocol, such as USB (Universal Serial Bus), ATA (Advanced Technology Attachment), SATA (Serial ATA), PCI-E (Peripheral Component Interconnect Express) or others.

Figure 2:
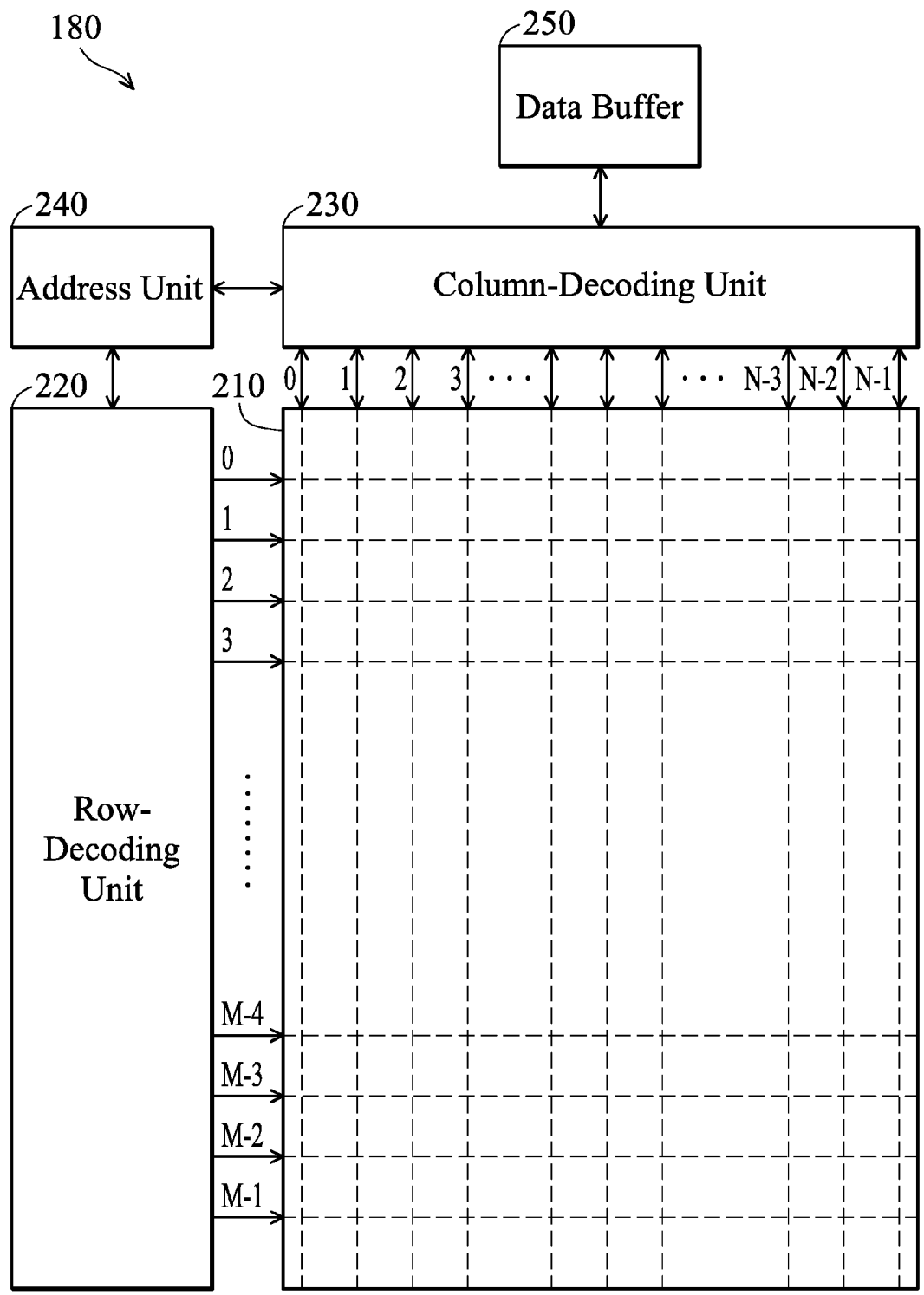
FIG. 2 shows a schematic diagram depicting a storage unit of a flash memory according to an embodiment of the invention.

FIG. 2 shows a schematic diagram depicting a storage unit of a flash memory according to an embodiment of the invention. A storage unit 180 includes an array 210 composed of M×N memory cells, and each memory cell may store at least one bit of information. The flash memory may be a NAND flash memory, etc. In order to appropriately access the desired information, a row-decoding unit 220 is used to select appropriate row lines for access. Similarly, a column-decoding unit 230 is employed to select an appropriate number of bytes within the row for output. An address unit 240 applies row information to the row-decoding unit 220 defining which of the N rows of the memory cell array 210 is to be selected for reading or writing. Similarly, the column-decoding unit 230 receives address information defining which one or ones of the M columns of the memory cell array 210 are to be selected. Rows may be referred to as wordlines by those skilled in the art, and columns may be referred to as bitlines. Data read from or to be applied to the memory cell array 210 is stored in a data buffer 250. Memory cells may be SLCs (Single-Level Cells), MLCs (Multi-Level Cells) or TLCs (Triple-Level Cells).

Figure 3:
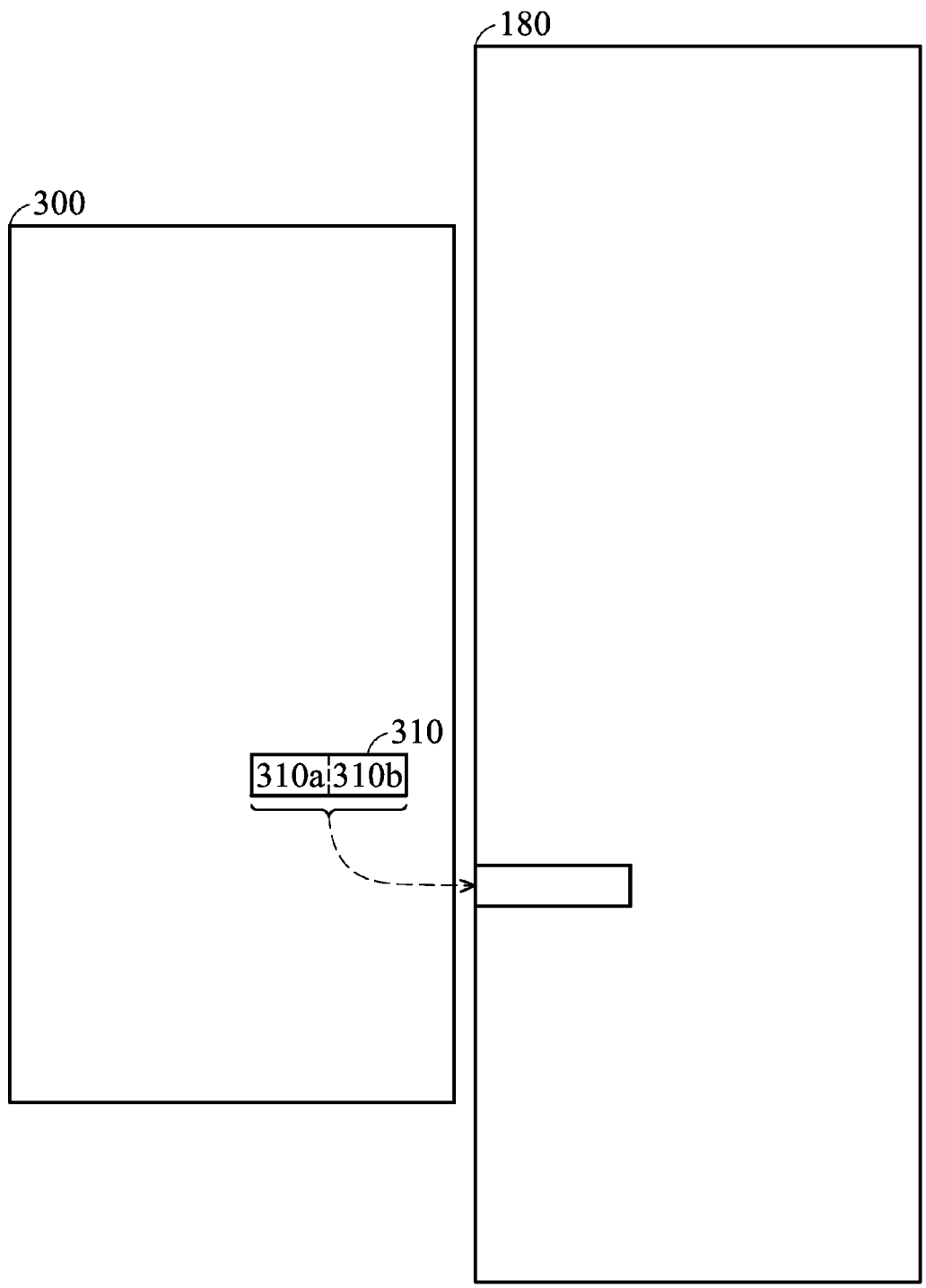
FIG. 3 is a schematic diagram illustrating the physical storage mapping according to an embodiment of the invention.
Figure 4:
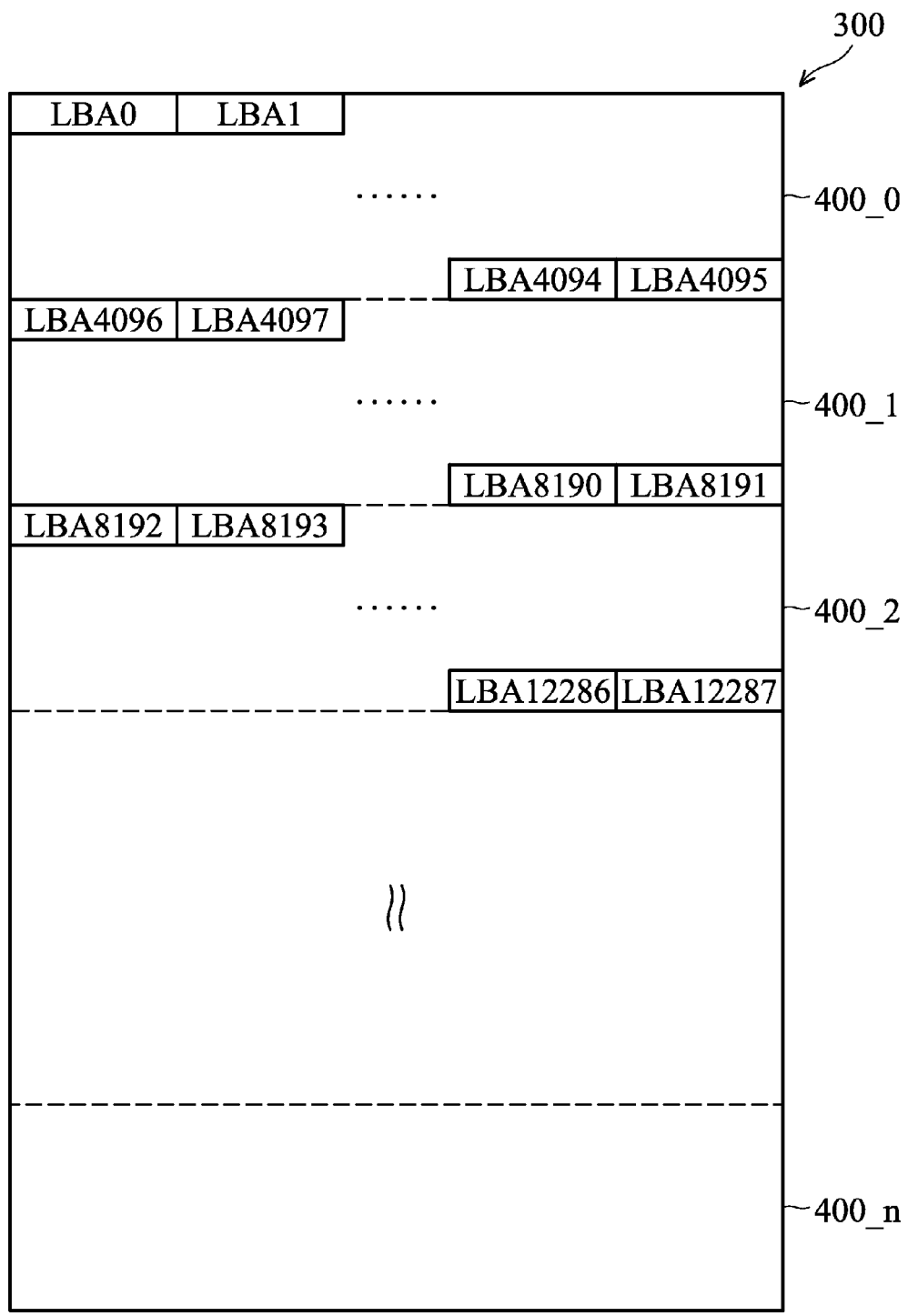
FIG. 4 is a schematic diagram of the division of a storage mapping table according to an embodiment of the invention.

A master device 160 may provide an LBA (Logical Block Address) to the processing unit 110 through the access interface 150 to indicate a particular region for data to be read from or written into. However, in order to optimize the data write efficiency, the access interface 170 distributes data with continuous LBAs across different physical regions of the storage unit 180. Thus, a storage mapping table, also referred to as an H2F (Host-to-Flash) table, is stored in a DRAM (Dynamic Random Access Memory) 120 to indicate which location in the storage unit 180 data of each LBA is physically stored in. FIG. 3 is a schematic diagram illustrating the physical storage mapping according to an embodiment of the invention. The storage mapping table 300 stores information regarding which location in the storage unit 180 data of each logical storage address is physically stored in, and the information is placed in the order of the logical storage addresses. The logical storage addresses may be represented by LBAs, and each LBA is associated with a fixed-length of physical storage space, such as 256K, 512K or 1024K bytes. For example, the storage mapping table 300 stores physical location information from LBA0 to LBA65535 in sequence. The physical location information 310 of a given number of continuous logical blocks may be indicated in four bytes, of which two bytes 310a record a block number and the other two bytes 310b record a unit number. For example, the four bytes may indicate a start block number and a start unit number of eight physical blocks, and the eight physical blocks may be collectively referred to as a host page. The storage mapping table 300 may need space ranging from 64M to 1 G bytes. Because the NAND flash devices are not random access, in order to improve the data write efficiency, the master device 160 is required to provide at least one logical block of continuous data, such as 512 bytes, such that the storage device can program the data into the storage unit 180 in an efficient way. When the master device 160 writes data of different logical blocks, for example, LBA0, LBA1000, LBA4500 and LBA10000, the corresponding physical location information of the storage mapping table 300 of the DRAM 180 is updated accordingly. To prevent the storage mapping table 300 of the DRAM 180 from disappearing after a power loss, an efficient method is required to program the updated storage location information of the storage mapping table 300 into the storage unit 180. However, if the updated physical location information (for example, of 2 bytes) is reflectively programmed into the storage unit 180 every time the master device 160 writes data of one logical block (for example, of 512K bytes), then the access interface 170 performs poorly due to the frequent programming. Therefore, in some embodiments, the storage mapping table 300 may be divided into n groups, and the group is the minimum unit to program into the storage unit 180. FIG. 4 is a schematic diagram of the division of a storage mapping table according to an embodiment of the invention. The storage mapping table 300 is divided into groups 400_0 to 400_n, and each group (for example, of 2K bytes) contains physical location information of 4096 logical blocks.

Figure 5:
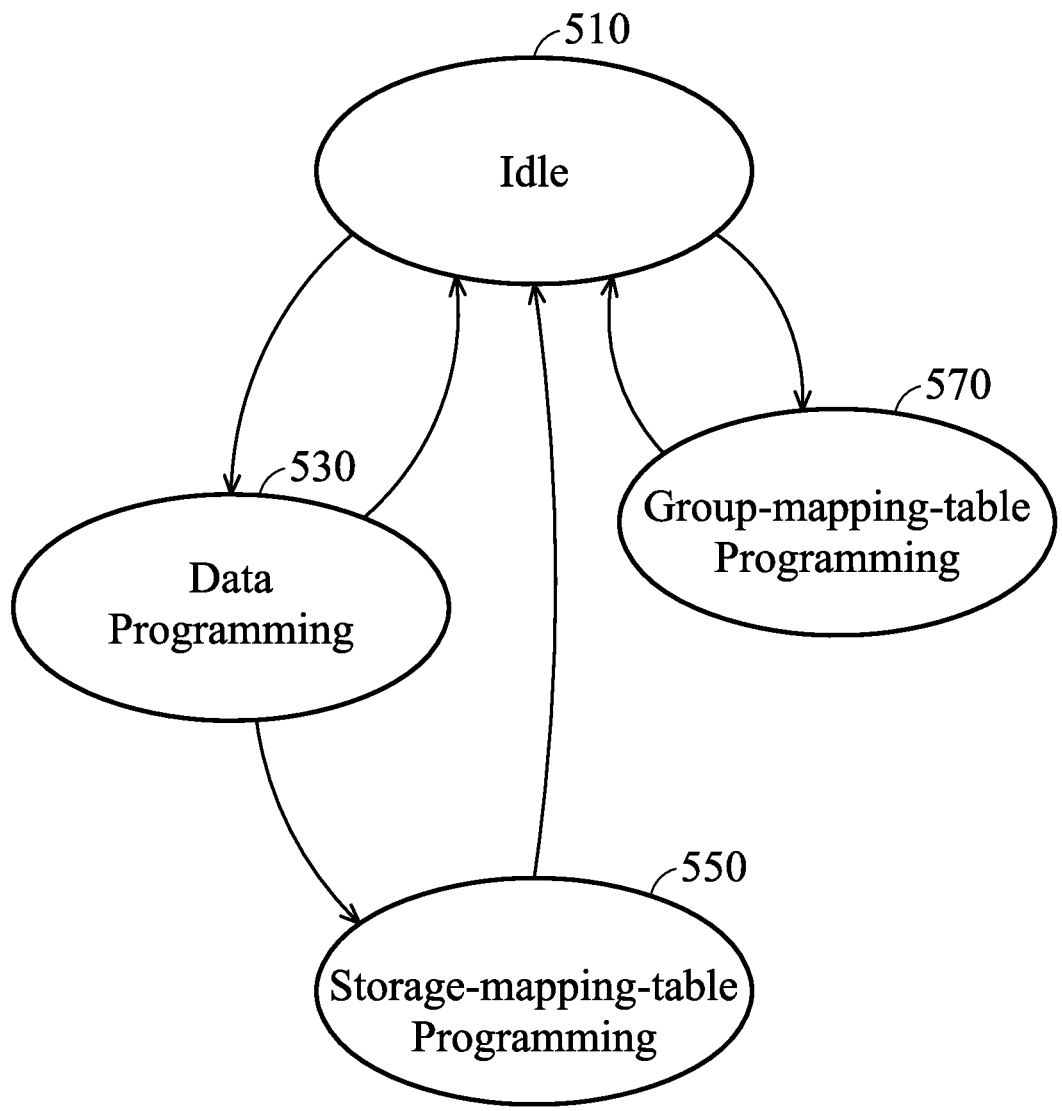
FIG. 5 is a state diagram for updating a storage mapping table according to an embodiment of the invention.
Figure 6:
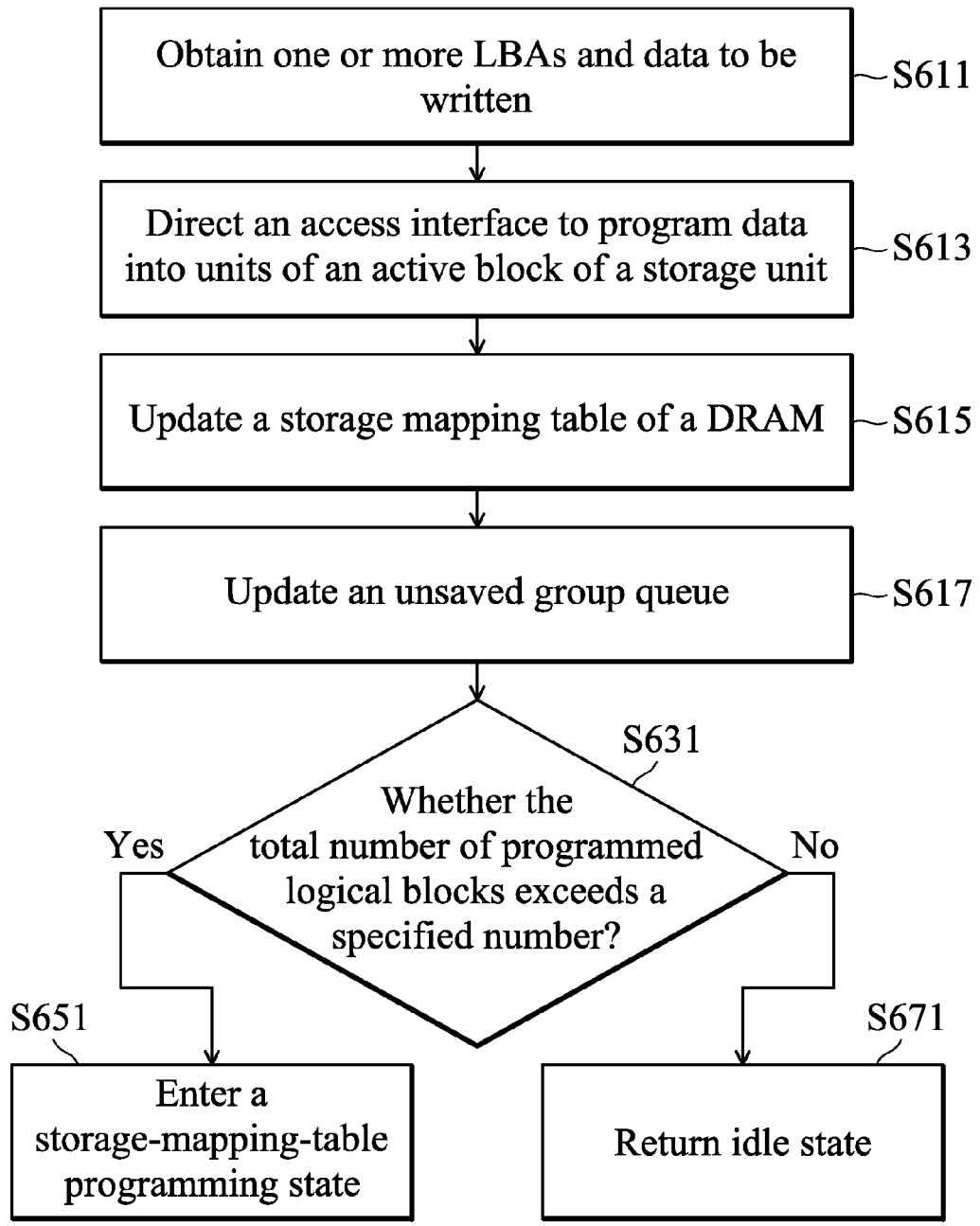
FIG. 6 is a flowchart illustrating a method performed in a data programming state according to an embodiment of the invention.

FIG. 5 is a state diagram for updating a storage mapping table according to an embodiment of the invention. The processing unit 110 enters different states and performs the needed operations for the entered states according to triggering events. The processing unit 110 initially stays in an idle state 510, and enters a data programming state 530 after receiving a write command from the master device 160 through the access interface 150. In the data programming state 530, the processing unit 110 performs a series of operations as described below to write data into the storage unit 180 and update the storage mapping table 300 stored in the DRAM 120. FIG. 6 is a flowchart illustrating a method performed in a data programming state according to an embodiment of the invention. After obtaining one or more LBAs and data to be written through the access interface 150 (step S611), the processing unit 110 directs the access interface 170 to program data into units of an active block of the storage unit 180 (step S613). The active block and the programmed units may be represented by a block number and unit numbers, respectively. Subsequently, the storage mapping table 300 of the DRAM 120 is updated to refresh the physical location information of the obtained LBA(s) (step S615), and an unsaved group queue is updated (step S617). The unsaved group queue may be stored in the DRAM 120 and contain information indicating which groups of storage mapping table 300 of the DRAM 120 have been updated but not stored in the storage unit 180. Assuming that the group division of the storage mapping table 300 is as shown in FIG. 4, the processing unit 110 programs data of LBA0, LBA1000, LBA4500 and LBA10000 into the storage unit 180 and updates the physical location information of LBA0, LBA1000, LBA4500 and LBA10000, which is stored accordingly in the storage mapping table 300 of the DRAM 180. The physical location information of LBA0, LBA1000, LBA4500 and LBA10000 belong to the $0^{th}$, $0^{th}$, $1^{st}$ and $2^{nd}$ groups, respectively. The processing unit 110 inspects whether the unsaved group queue includes these group numbers, and if not, then the absent group number(s) is/are stored in the unsaved group queue. For example, when the unsaved group queue stores the group numbers "0", "1", "8" and "10", the group number "2" is appended into the unsaved group queue. Next, the processing unit 110 determines whether the total number of programmed logical blocks exceeds a specified number, for example 7680 (step S631). If so, a storage-mapping-table programming state 550 is entered (step S651); otherwise, the idle state 510 is returned to (step S671). The determination of step S631 may be achieved by checking a write counter. The write counter increases by one each time a data programming of a logical block is completed, and is reset to zero after operations of the storage-mapping-table programming state 550 are finished. It should be noted that, by way of the determination step S631, the updated groups of the storage mapping table 300 are programmed into the storage unit 180 after the specified number of logical blocks has been programmed, so as to avoid the aforementioned drawbacks.

Figure 7:
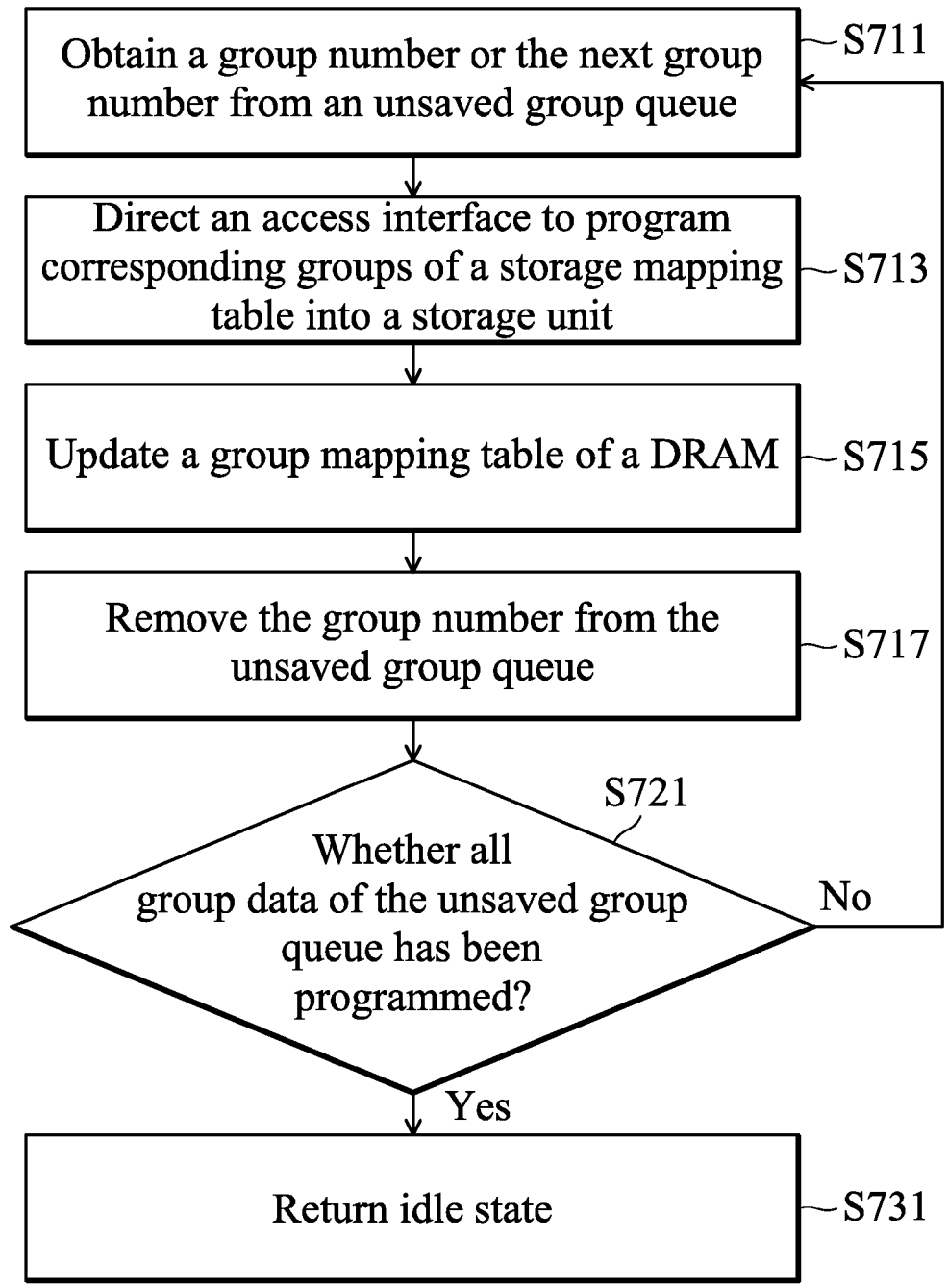
FIG. 7 is a flowchart illustrating a method performed in a storage-mapping-table programming state according to an embodiment of the invention.
Figure 8:
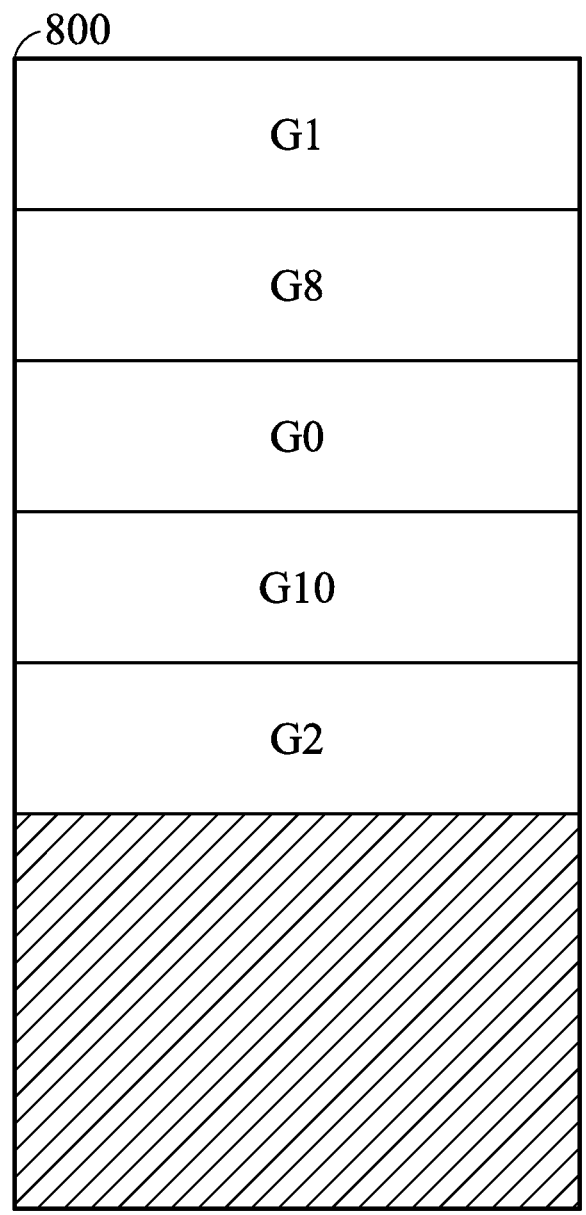
FIG. 8 is a schematic diagram of an unsaved group queue according to an embodiment of the invention.
Figure 9:
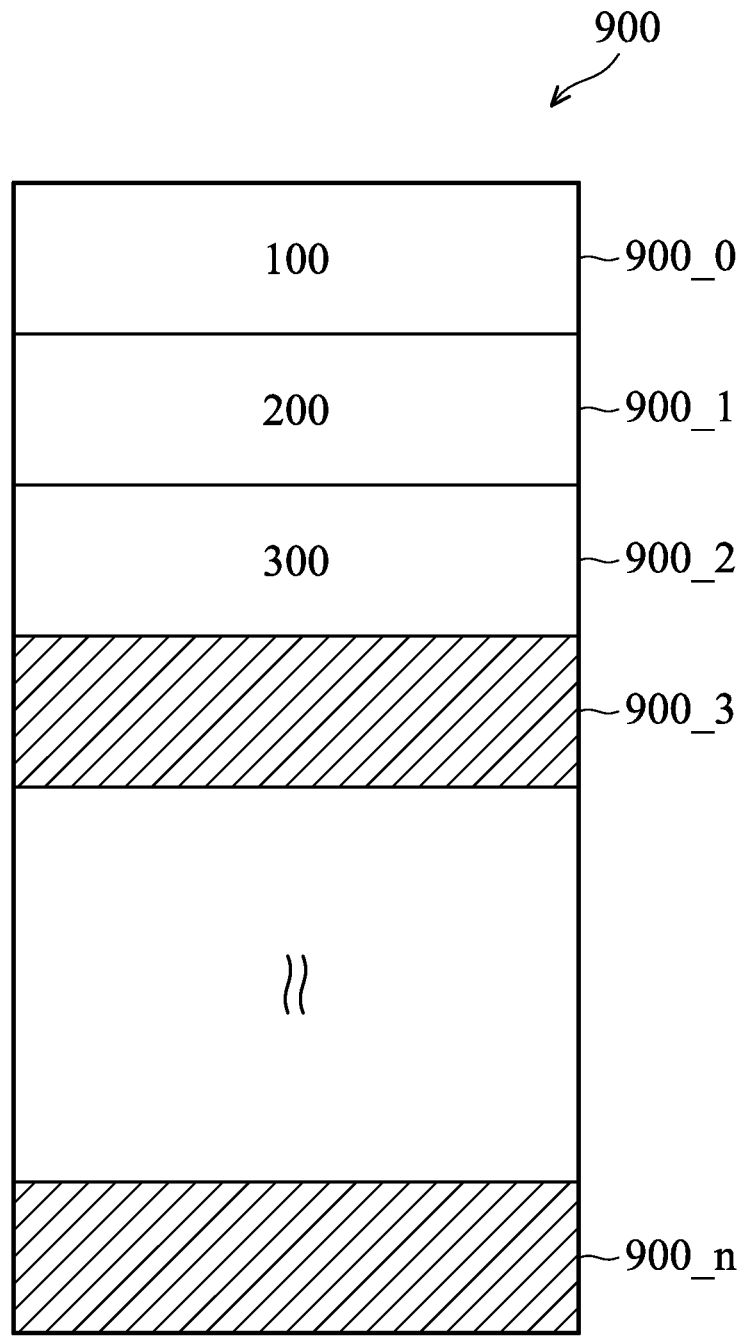
FIG. 9 is a schematic diagram of a group mapping table according to an embodiment of the invention.

FIG. 7 is a flowchart illustrating a method performed in a storage-mapping-table programming state according to an embodiment of the invention. The process repeatedly performs a loop until all groups of the storage mapping table 300 indicated by the unsaved group queue have been programmed into the storage unit 180 (steps S711 to S721). FIG. 8 is a schematic diagram of an unsaved group queue according to an embodiment of the invention. An unsaved group queue 800 may be implemented in an array including cells and each cell stores information indicating that a particular group of the storage mapping table 300 of the DRAM 120 has been updated but not programmed into the storage unit 180. For example, "G1" indicates the $1^{st}$ group of the storage mapping table 300, "G8" indicates the $8^{th}$ group thereof, and the others can be deduced by analogy. In each run of the loop, the processing unit 110 obtains a group number or the next group number from the unsaved group queue 800 (step S711) and directs the access interface 170 to program the corresponding groups of the storage mapping table 300 into the storage unit 180 (step S713). It should be noted that the storage unit 180 may prepare one or more specified blocks to store data of the storage mapping table 300, such as blocks 10 to 17, and the access interface 170 may program group data into spare units of the prepared blocks, other than overwriting previously programmed group data. The group data may be programmed along the order of programming times. Although only one logical block's physical storage information is updated during the data programming state 530, the processing unit 110 programs the whole physical storage information of the group into the storage unit 180. Subsequently, the processing unit 110 updates a group mapping table of the DRAM 120, also referred to as a G2F (Group-to-Flash) table, to indicate that the latest data of this group of the storage mapping table 300 is stored in which location in the storage unit 180 (step S715), and removes the group number from the unsaved group queue (step S717). FIG. 9 is a schematic diagram of a group mapping table according to an embodiment of the invention. A group mapping table is implemented in an array and cells 900_0 to 900_n are used to record which physical locations of the storage unit 180 store the latest data of the groups respectively, in the order of the group numbers. For example, the group mapping table 900 indicates that the latest data of groups G0, G1 and G2 is stored in the $100^{th}$, $200^{th}$ and $300^{th}$ units respectively. When data of all logical blocks corresponding to a group has not been programmed into the storage unit 180, the corresponding cell of the group mapping table 900 stores a null value and the null value may be set to "0xFF". For example, the cell 900_3 in slashes as shown in FIG. 9 and storing a null value indicates that data of all logical blocks corresponding to the group G3 has not been programmed into the storage unit 180. Next, the processing unit 110 determines whether all group data of the unsaved group queue has been programmed (step S721). If so, the idle state 510 is returned to; otherwise, the flow goes back to step S711 to process the next un-programmed group. In step S721, the processing unit 110 determines that all group data has been programmed when discovering that the unsaved group queue is empty.

Figure 10:
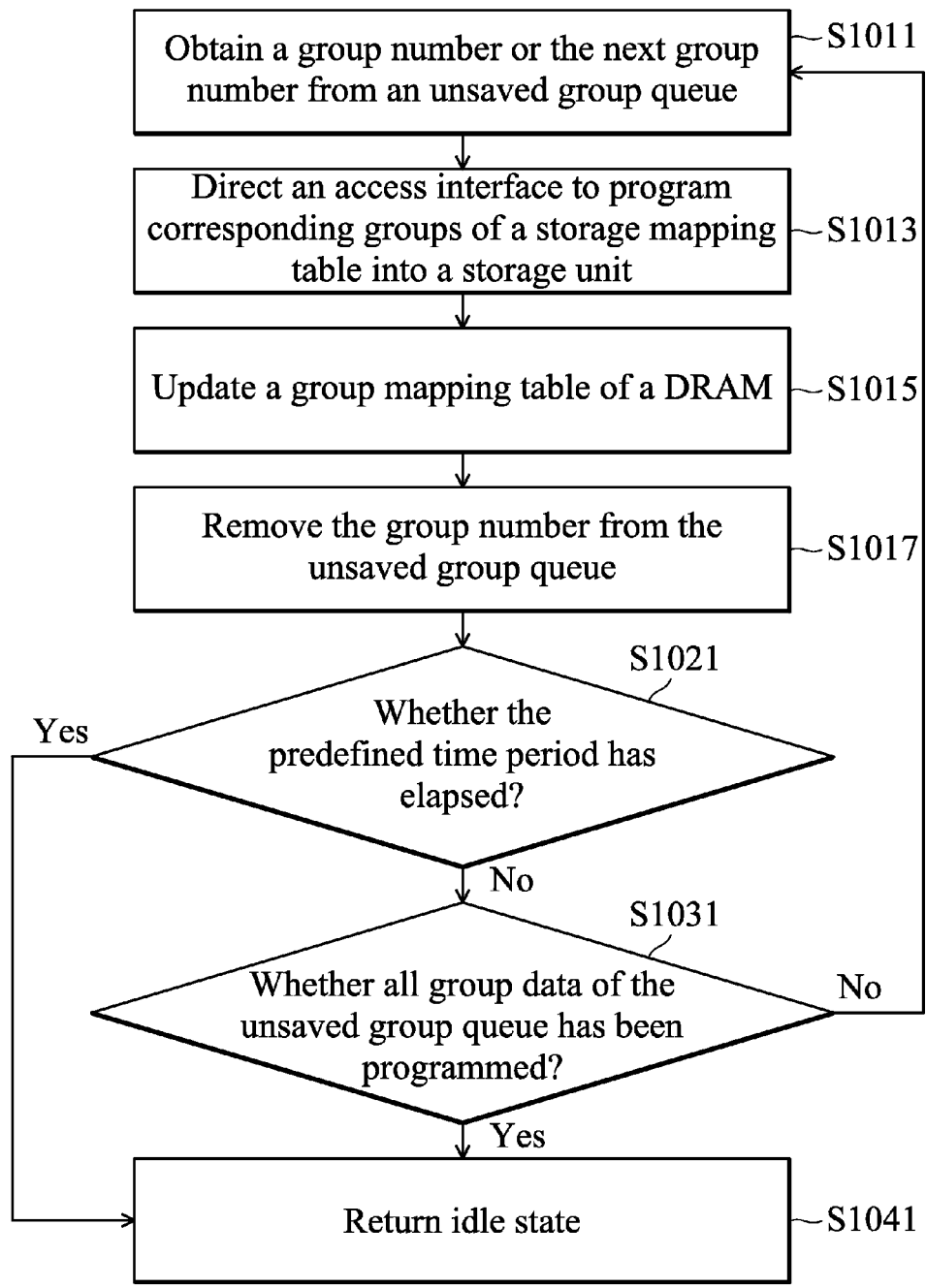
FIG. 10 is a flowchart illustrating a method performed in a group-mapping-table programming state according to an embodiment of the invention.

However, the more unsaved groups that remain, the more time it takes to store the unsaved groups of the DRAM 120 to the storage unit 180. It may cause a data read or write command received from the master device 160 through the access interface 150 to time out and fail to process when the received data read or write command waits for the completion of a programming of excessive group data into the storage unit 180. In some embodiments, the processing unit 110 may limit the programming of group data to a predefined time period to avoid the aforementioned problem. FIG. 10 is a flowchart illustrating a method performed in a group-mapping-table programming state according to an embodiment of the invention. Details of steps S1011 to S1017, S1031 and S1041 may be referred to in the description of steps S711 to S717, S721 and S731, respectively, and are omitted here for brevity. The processing unit 110 may activate a timer when entering the storage-mapping-table programming state 550, and the timer will expire after the predefined time period, such as 35 ms (milliseconds). After each run of a group data programming (steps S1011 to S1017), the processing unit 110 determines whether the predefined time period has elapsed (step S1021). If so, the process forcibly returns to the idle state 510 regardless of whether all group data has been programmed (step S1041); otherwise, the process proceeds to the determination of step S1031. In step S1021, the processing unit 110 determines that the predefined time period has elapsed when the timer has expired.

Figure 11:
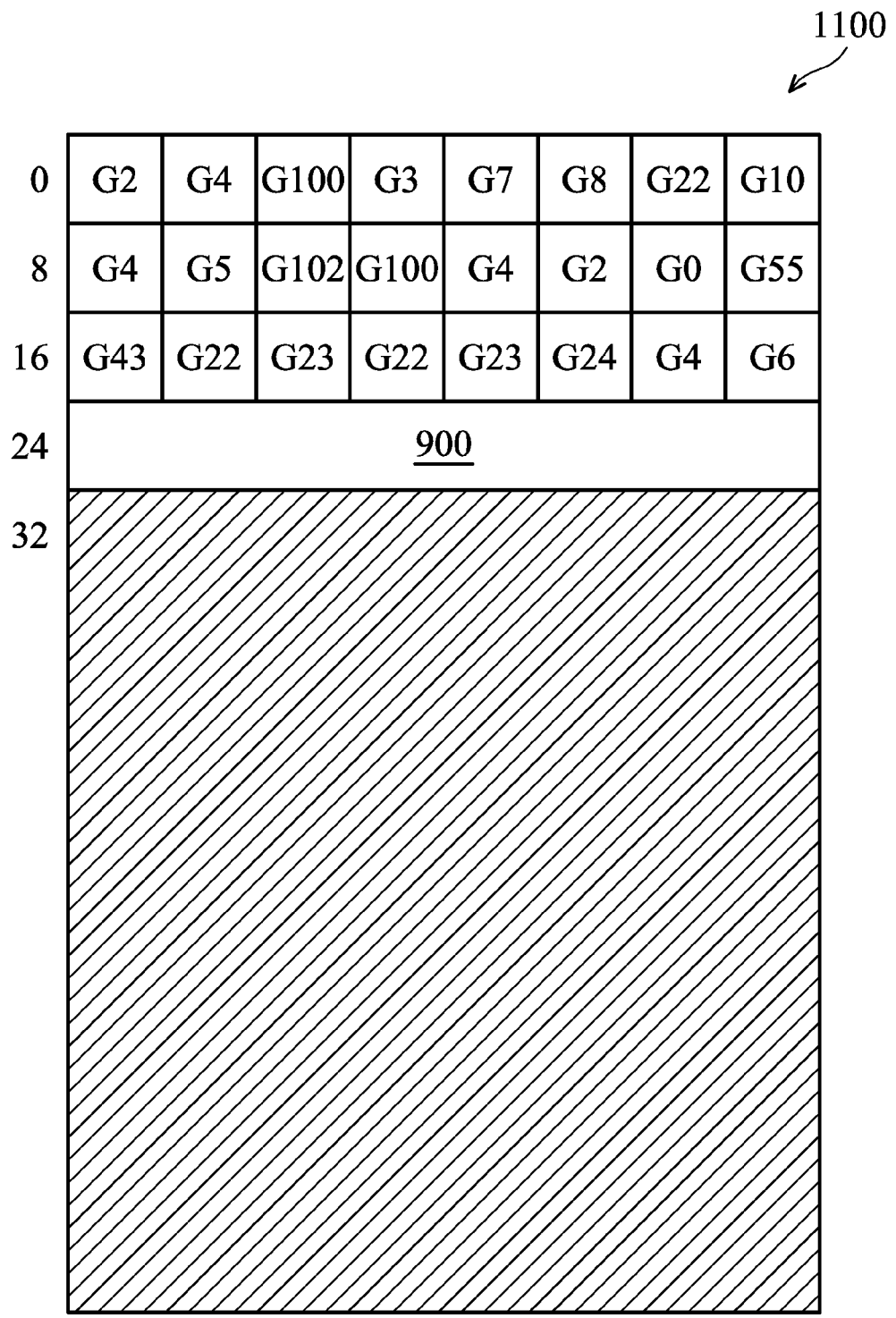
FIG. 11 is a schematic diagram for storing group data and a group mapping table according to an embodiment of the invention.

Refer back to FIG. 5. When staying in the idle state 510 and receiving a standby immediate command, the processing unit 110 enters a group-mapping-table programming state 570. In the group-mapping-table programming state 570, the processing unit 110 directs the access interface 170 to program the group mapping table 900 of the DRAM 120 into the storage unit 180. The storage unit 180 may allocate one or more specified blocks to store the storage mapping table 300, and the access interface 170 may obtain one page of available space from the specified blocks to store the group mapping table 900. It should be noted that the group mapping table 900 is stored to follow the programmed group data. FIG. 11 is a schematic diagram for storing group data and a group mapping table according to an embodiment of the invention. A specified block 1100 for storing data of the storage mapping table 300 contains many pages. Assume that one page contains eight units and each unit may store one group of data: When the groups of the storage mapping table 300 are programmed into the $0^{th}$ to the $23^{rd}$ units in sequence, the group mapping table 900 is programmed into one page including the $24^{th}$ to the $31^{st}$ units. The $32^{nd}$ unit and the following (in slashes) are unused storage space.

Figure 12:
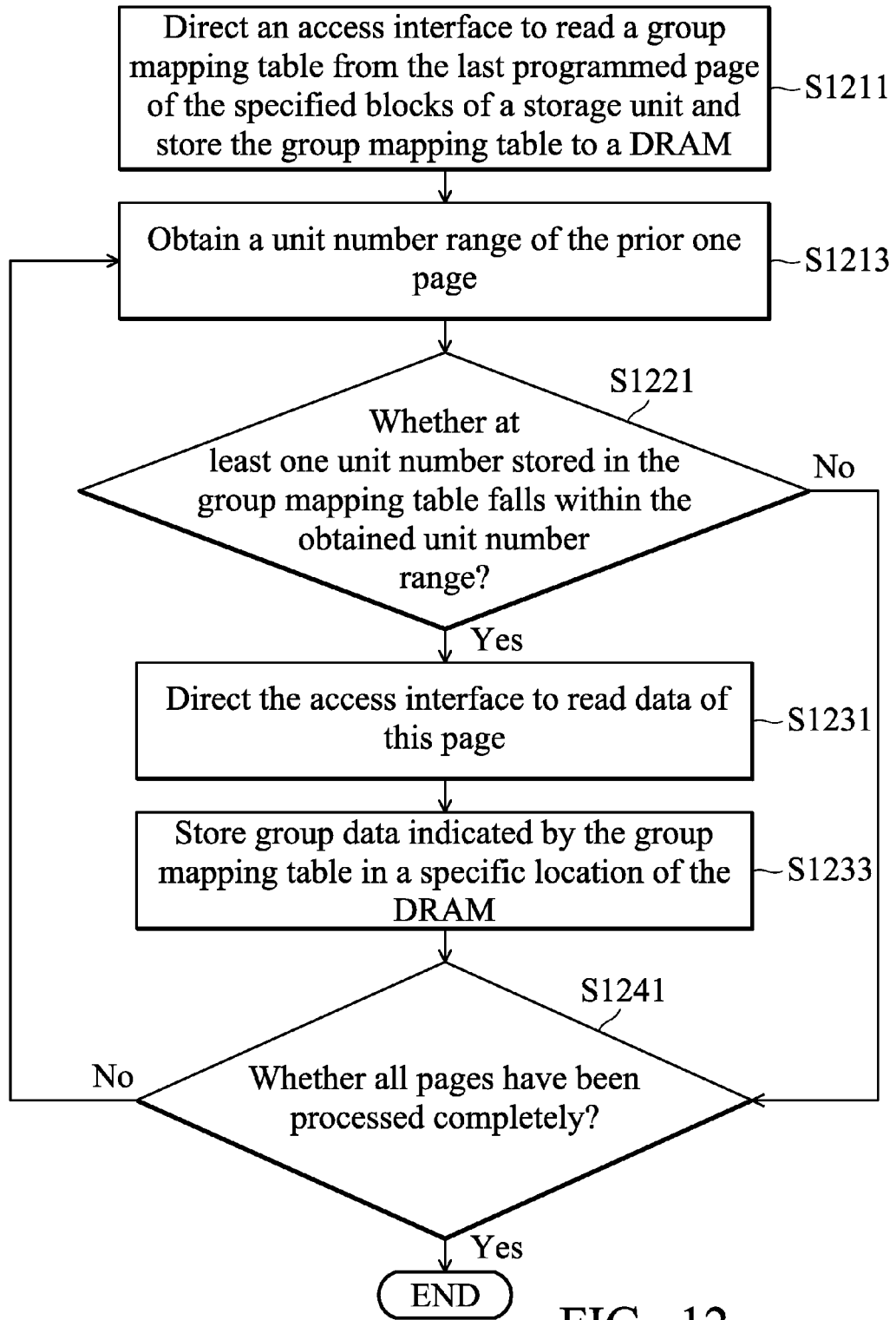
FIG. 12 is a flowchart illustrating a method for rebuilding a storage mapping table according to an embodiment of the invention.

When the flash memory powers up, the processing unit 110 rebuilds the storage mapping table 300 of the DRAM 120 as shown in FIG. 4 according to the group mapping table 900 and the group data of the storage unit 180. FIG. 12 is a flowchart illustrating a method for rebuilding a storage mapping table according to an embodiment of the invention. First, the processing unit 110 directs the access interface 170 to read a group mapping table from the last programmed page of the specified blocks of the storage unit and stores the group mapping table to the DRAM 120 (step S1211). Next, a loop (steps S1213 to S1214) is repeatedly performed to read the latest data of each group according to the content of the group mapping table and store the latest group data to the DRAM 120. Specifically, in each run, after obtaining a unit number range of the prior one page, such as the unit numbers 16 to 23 (steps S1213), the processing unit 110 determines whether at least one unit number stored in the group mapping table falls within the obtained unit number range (step S1221). If so (the "yes" path of step S1221), it means that this page including the unit number range obtained in step S1213 stores the latest data of at least one group and the processing unit 110 directs the access interface 170 to read data of this page (step S1231) and stores group data indicated by the group mapping table 900 in a specific location of the DRAM 120 (step S1233). It should be noted that the determination of step S1221 avoids unnecessary page read: in other words, if all unit numbers stored in the group mapping table do not fall within the obtained page number range, then the process skips this page. However, those skilled in the art may devise a process to omit the determination step S1221, read all group data page by page and determine whether to update the content of the storage mapping table 300 according to the group mapping table 900. Taking as an example the embodiment shown in FIG. 11, assume that the group mapping table 900 indicates data of groups G4, G6, G22, G23, G24 and G43 is stored in the $22^{nd}$, $23^{rd}$, $19^{th}$, $20^{th}$, $21^{st}$ and $16^{th}$ units respectively: After reading the $2^{nd}$ page of data from the storage unit 180, the processing unit 110 stores data of the $22^{nd}$, $23^{rd}$, $19^{th}$, $20^{th}$, $21^{st}$ and $16^{th}$ units to locations of the DRAM 120, which are allocated for groups G4, G6, G22, G23, G24 and G43. The processing unit 110 determines whether all pages have been processed completely (step S1241). If so, the whole rebuild of the storage mapping table ends; otherwise, the process proceeds back to step S1213 to process data of the previous page. In step S1241, it is determined that all pages are processed completely when the processing unit 110 knows that the currently processed page is the $0^{th}$ page.

Although the embodiment has been described as having specific elements in FIGS. 1 and 2, it should be noted that additional elements may be included to achieve better performance without departing from the spirit of the invention. While the process flow described in FIGS. 6, 7, 10 and 12 includes a number of operations that appear to occur in a specific order, it should be apparent that these processes can include more or fewer operations, which can be executed serially or in parallel (e.g., using parallel processors or a multi-threading environment).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for maintaining a storage mapping table, performed by a processing unit, comprising:
   directing an access interface to read a group mapping table from the last page of a block of a storage unit, wherein the block is allocated to store data of a plurality of groups, each group stores information indicating which location in the storage unit stores data of an LBA (Logical Block Address) range, and the group mapping table stores information indicating which unit of the block stores the latest data of each group; and
   storing the group mapping table to a DRAM (Dynamic Random Access Memory);
   directing the access interface to read data of each group from the storage unit according to the group mapping table; and
   storing the data of each group in a specified location of a storage mapping table of the DRAM,
   wherein, in the step of storing the data of each group in a specified location of a storage mapping table of the DRAM further comprises:
   storing data of the groups of the storage mapping table into the DRAM according to the order of the LBAs.

2. The method of claim 1, wherein, in the step of directing the access interface to read data of each group from the storage unit according to the group mapping table further comprises:
   directing the access interface to read data of the groups from the last page to the first page of the storage unit according to the group mapping table.

3. The method of claim 2, wherein each page contains data of more than one group.

4. The method of claim 2, wherein, in the step of directing the access interface to read data of each group from the storage unit according to the group mapping table, further comprises:
   obtaining a unit number range of each page from the last page to the first page;
   determining whether at least one unit number stored in the group mapping table falls within the obtained unit number range of each page;
   if so, directing the access interface to read data of the page; and
   otherwise, skipping the page.

5. The method of claim 1, wherein the data of the groups are stored in the group mapping table according to the order of the LBAs.

6. The method of claim 5, wherein the group mapping table comprises a plurality of cells and at least one cell stores information indicating which unit of the block stores data of a group with an LBA range.

7. The method of claim 6, wherein at least one cell stores a null value to indicate data of all logical blocks corresponding to a group that has not been programmed into the storage unit.

8. The method of claim 1, wherein the method is performed when a flash memory powers up, and the flash memory comprises the processing unit and the access interface.

9. An apparatus for maintaining a storage mapping table, comprising:
an access interface, coupled to a storage unit;
a processing unit, coupled to the access interface, directing the access interface to read a group mapping table from the last page of a block of a storage unit, wherein the block is allocated to store data of a plurality of groups, each group stores information indicating which location in the storage unit stores data of an LBA (Logical Block Address) range, and the group mapping table stores information indicating which unit of the block stores the latest data of each group; storing the group mapping table to a DRAM (Dynamic Random Access Memory); directing the access interface to read data of each group from the storage unit according to the group mapping table; and storing the data of each group in a specified location of a storage mapping table of the DRAM,
wherein the processing unit further stores data of the groups of the storage mapping table into the DRAM according to the order of the LBAs.

10. The apparatus of claim 9, wherein the processing unit further directs the access interface to read data of the groups from the last page to the first page of the storage unit according to the group mapping table.

11. The apparatus of claim 10, wherein each page contains data of more than one group.

12. The apparatus of claim 10, wherein the processing unit obtains a unit number range of each page from the last page to the first page; determines whether at least one unit number stored in the group mapping table falls within the obtained unit number range of each page; if so, directs the access interface to read data of the page; and otherwise, skips the page.

13. The apparatus of claim 9, wherein the data of the groups are stored in the group mapping table according to the order of the LBAs.

14. The apparatus of claim 9, wherein the group mapping table comprises a plurality of cells and at least one cell stores information indicating which unit of the block stores data of a group with an LBA range.

15. The apparatus of claim 14, wherein at least one cell stores a null value to indicate data of all logical blocks corresponding to a group that has not been programmed into the storage unit.

16. The apparatus of claim 9, wherein the processing unit when being powered up rebuilds the storage mapping table of the DRAM.

* * * * *